United States Patent
Panicker et al.

(10) Patent No.: US 6,744,835 B1
(45) Date of Patent: Jun. 1, 2004

(54) METHODS AND APPARATUS FOR IMPLEMENTING AN INTERPOLATION FINITE IMPULSE RESPONSE (FIR) FILTER FOR USE IN TIMING RECOVERY

(75) Inventors: Thomas Mathew Panicker, San Diego, CA (US); Thomas M. Zeng, San Diego, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 534 days.

(21) Appl. No.: 09/588,142

(22) Filed: Jun. 2, 2000

(51) Int. Cl.$^7$ ................................................. H04L 7/00
(52) U.S. Cl. ...................... 375/355; 375/350; 708/300
(58) Field of Search ................................. 375/229, 232, 375/285, 346, 348, 350, 355, 362, 371; 708/300, 290, 313

(56) References Cited

U.S. PATENT DOCUMENTS

| | | | | |
|---|---|---|---|---|
| 5,018,090 A | * | 5/1991 | Shiratsuchi | 708/290 |
| 5,517,535 A | * | 5/1996 | Kroeger et al. | 375/373 |
| 5,566,214 A | * | 10/1996 | Kroeger et al. | 375/355 |
| 5,579,345 A | * | 11/1996 | Kroeger et al. | 375/344 |
| 5,768,323 A | * | 6/1998 | Kroeger et al. | 375/355 |
| 5,933,452 A | * | 8/1999 | Eun | 375/232 |
| 6,414,990 B1 | * | 7/2002 | Jonsson et al. | 375/232 |

OTHER PUBLICATIONS

Jim Thompson, "Care and Feeding of the One Bit Digital to Analog Converter", University of Washington, Jun. 8, 1995, p. 1–7.

* cited by examiner

Primary Examiner—Jean B. Corrielus
(74) Attorney, Agent, or Firm—Seed IP Law Group PLLC

(57) ABSTRACT

A finite impulse response (FIR) filter employing hybrid coefficients for use in analog-to-digital and digital-to-analog conversion. Clock jitter introduced by the transmission medium may be compensated for by calculating an early interpolated data value and a late interpolated data value for each data point, and using the difference between the early and late interpolated values to produce a correction signal to the slicer clock in the converter. Hardware may be minimized by employing a hybrid coefficient in each filter tab which is reflective of the difference between an early and a late interpolated data value.

18 Claims, 9 Drawing Sheets

METHODS AND APPARATUS FOR IMPLEMENTING AN INTERPOLATION FINITE IMPULSE RESPONSE (FIR) FILTER FOR USE IN TIMING RECOVERY

BACKGROUND OF THE INVENTION

1. Technical Field

The present invention relates, generally, to a timing recovery circuit for use in telecommunications applications and, more particularly, to an improved finite impulse response interpolation filter for use in adjusting the sampling clock.

2. Background of the Invention

Data transmission systems, for example, telecommunications systems, are capable of transmitting large volumes of data at very high speeds. In recovering transmitted data, it is often necessary to compensate for the effects of the channel. For example, when data is sent through the Public Switched Telephone Network (PSTN), the analog loop tends to impart jitter, distortion, and other channel effects to the data. Accordingly, upon receiving and recovering the data, it is important to ensure that the data is sampled synchronously with the clock which controlled the data transmission. Efficient and accurate timing recovery is essential to preserving the integrity of transmitted data.

In a T1/E1 Receive Line Interface Unit (RLIU), timing recovery and input data jitter tolerance requirements are laid out in AT&T publication number 62411, the entire contents of which are hereby incorporated by reference. Thus, companies desiring to provide data communications chip sets, and particularly transceiver chip sets, for use in connection with the PSTN generally strive to comply with the requirements set forth in AT&T Pub 62411.

Many different techniques have been employed to compensate for jitter imposed on a data stream by the communication channel. One such technique is known as the Tiernan Communications Design, wherein a zero-crossing algorithm running at two times symbol rate is employed. This technique is desirable because it focuses on the zero-crossing point, which is generally quite easy to detect at the receiver circuit. However, the signal to noise ratio near the zero-crossing is quite low, making this technique ill-suited for many applications.

Another prior art technique for timing recovery is known as early-late detection, and is typically employed in a four times sampling mode. In this technique, the difference between an early and a late sample around the symbol are taken, and this information is used to adjust the sampling clock. Although this technique is theoretically attractive, the four times sampling rate computational requirement is difficult to achieve within the power and die size constraints needed to produce competitive products.

A timing recovery technique is thus needed which overcomes the shortcomings of the prior art.

SUMMARY OF THE INVENTION

In accordance with a preferred embodiment of the present invention, an "early" sample value and a "late" sample value are calculated from a single sampled data point, and the early and late sample information used to adjust the timing of the sampling clock. In accordance with a particularly preferred embodiment, the early and late sample points are calculated from the sampled data point and zero crossing, eliminating the need to physically retrieve early and late sampled data. This effectively provides 4x sampling information in the context of a 2x sampling chip set.

In accordance with a further aspect of the present invention, rather than employing a first filter to compute an early sample point and a second filter to compute a late sample point, a single multiplication stage is employed to compute the difference between the early and the late interpolated data points, with the "difference" being manifested as a predetermined multiplier coefficient within the filter.

In accordance with a further aspect of the present invention, the algorithm of the present invention may be generalized to accommodate virtually any filter order and virtually any number of desired interpolation points, using only a single multiplication stage for any number of desired interpolation points.

BRIEF DESCRIPTION OF THE DRAWING FIGURES

DETAILED DESCRIPTION OF PREFERRED EXEMPLARY EMBODIMENTS

Figure 1:
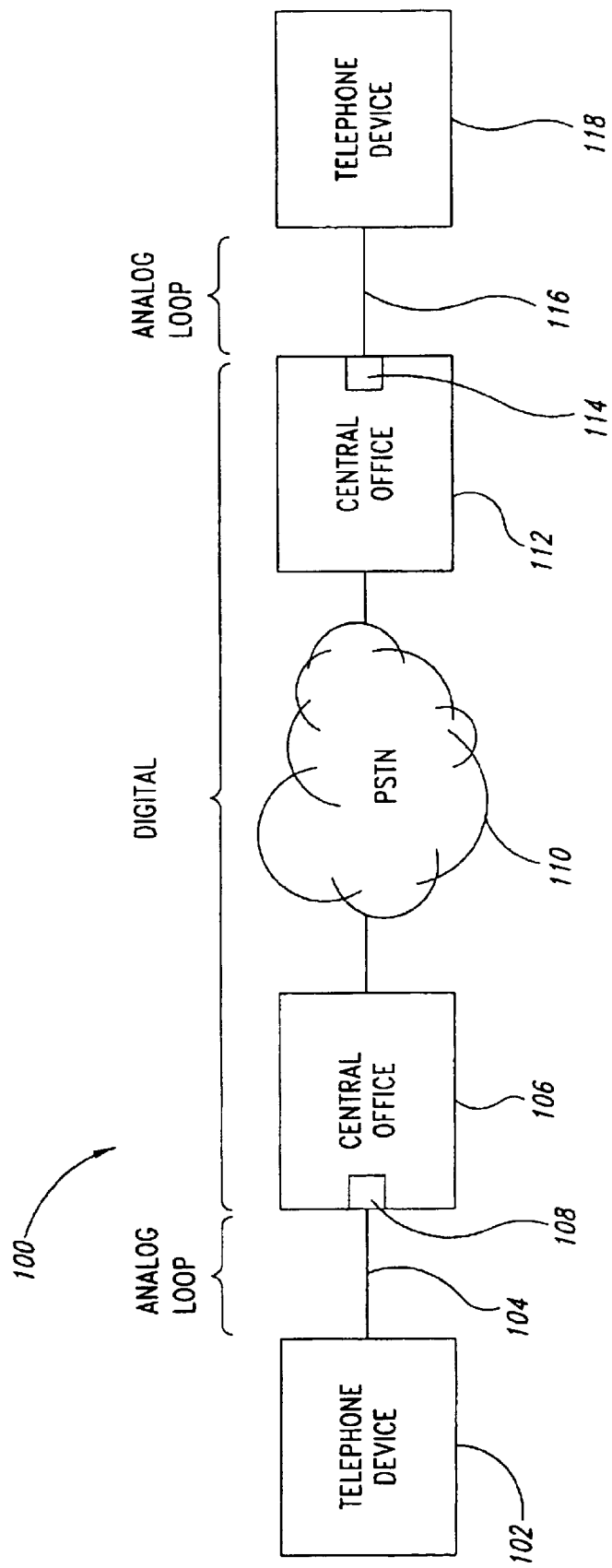
FIG. 1 is a schematic block diagram of a telecommunications channel from one peer telephone device to another peer telephone device through the public switched telephone network.

Referring now to FIG. 1, a typical peer-to-peer telecommunications transmission path suitably comprises respective first and second peer telephone devices 102 and 118 connected through their respective central offices 106 and 112 and the Public Switched Telephone Network (PSTN) 110. Each of telephone devices 102, 118 may suitably comprise an analog telephone, a digital telephone, a fax machine, a voice modem, a fax modem, a data modem, or any other device which utilizes the PSTN. In the illustrated communication system, telephone device 102 is connected to its central office 106 by an analog loop 104, and telephone device 118 is connected to its central office 112 through an analog loop 116. Those skilled in the art will appreciate that the portion of communication channel from central office 106, through PSTN 110 and terminating at central office 112, is essentially a hybrid communications system, but is generally regarded as being a purely digital transmission medium. Inasmuch as the central offices typically communicate with telephone devices 102 and 118 through an analog loop, it is necessary for the central office to perform analog to digital and digital to analog data conversion.

Central offices 106 and 112 suitably include respective interface units 108 and 114. In accordance with one aspect of the present invention, a suitable interface may comprise a BT8370 T1/E1 receiver framer available from Conexant Systems, Inc., of Newport Beach, Calif. Those skilled in the art will appreciate that the "T1" paradigm is employed in the United States, and corresponds to a bit rate of 1.554 MHz, while the "E1" refers to the European paradigm which operates at 2.048 MHz. Respective interface devices 108 and 114 are also often referred to as transceiver chips, inasmuch as they both transmit and receive data and, hence, must necessarily perform analog to digital as well as digital to analog data conversion functions. In accordance with one aspect of the present invention, the filtering techniques and algorithms of the present invention are equally applicable to both the analog and digital implementation of the interface; for clarity, however, only the digital implementation of receiver 108 is explained in detail, it being understood that the same techniques can equally be applied to the analog implementation of the interface. Moreover, although both interfaces 108 and 114 suitably provide the same functionality, for simplicity the ensuing discussion is limited to interface 108, it being understood that the same functionality may also be employed by interface 114.

Figure 2:
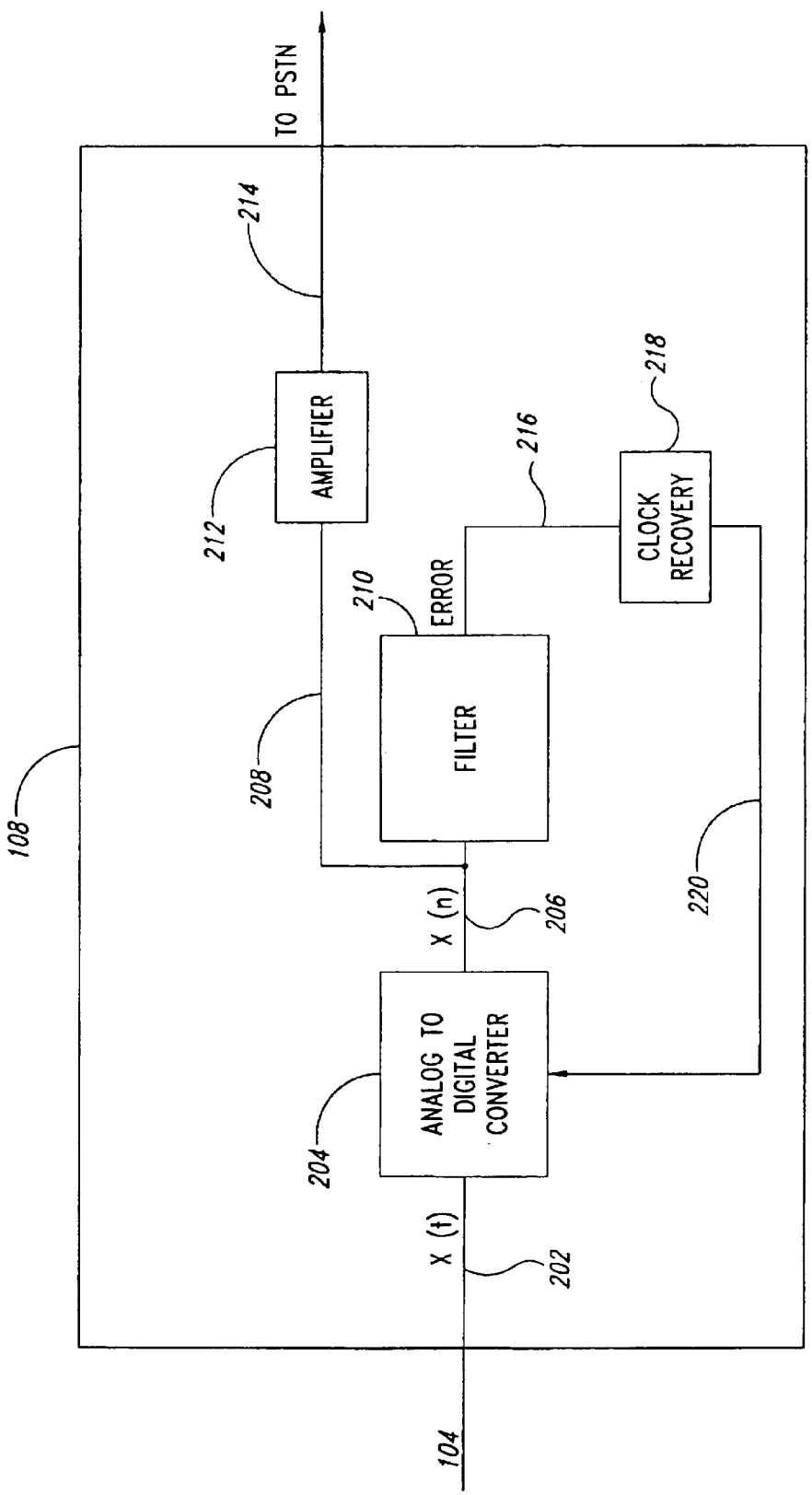
FIG. 2 is a functional schematic block diagram of an exemplary transceiver.

Referring now to FIG. 2, an exemplary transceiver 108 suitably comprises an analog to digital converter 204, a filter 210, an amplifier 212, and a clock recovery circuit 218. When operating in the analog to digital mode, analog data 104 is received by transceiver 108, and each analog data "point" x(i) 202 is serially applied to analog-to-digital converter (ADC) 204. ADC 204 "slices" the data, as is well known in the art, and outputs digital data pulses 206 corresponding to the converted analog data. The digital output 206 may be applied to an amplifier 212, and thereafter output in digital form (represented by an "output" line 214) to the PSTN. The output of ADC 204 may also be applied to filter 210, wherein an error signal 216 is computed and fed to clock recovery circuit 218. Clock recovery circuit 218 suitably outputs a control signal 220 to adjust the sampling clock (not shown) affiliated with ADC 204.

Figure 3:
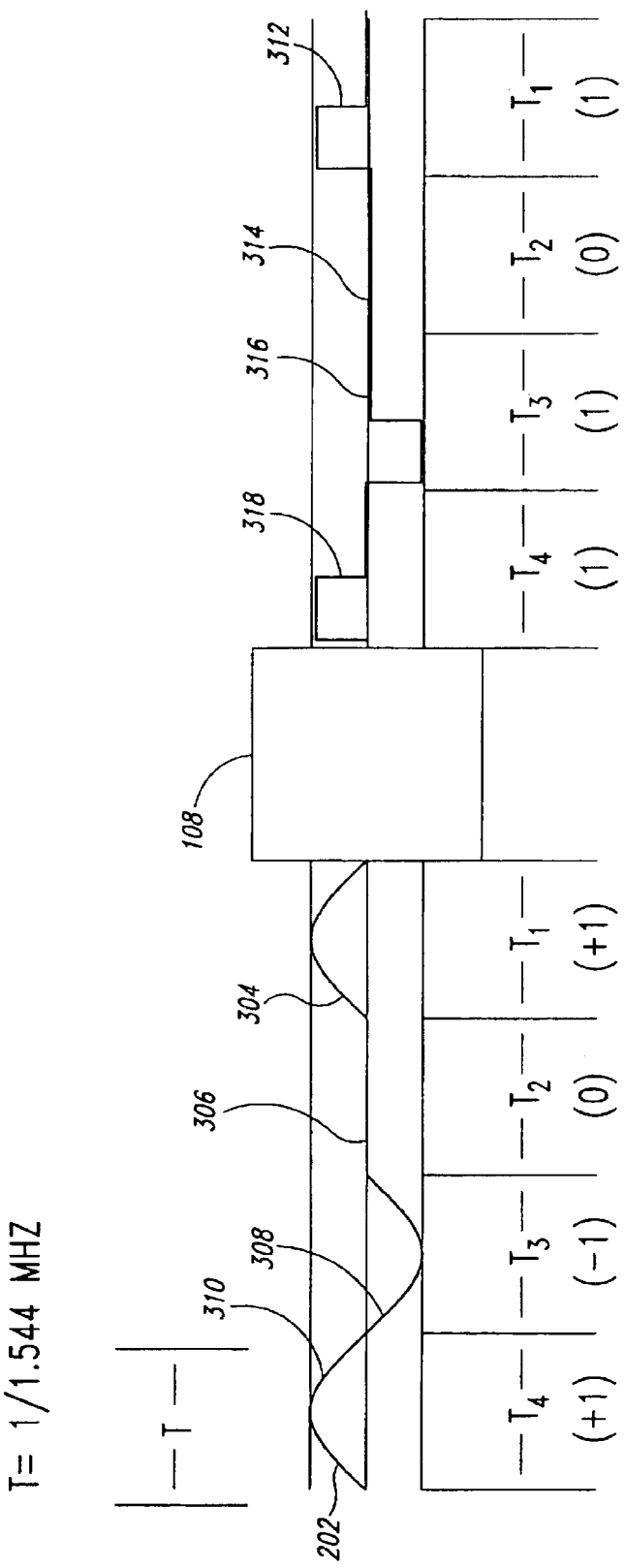
FIG. 3 is a schematic representation of an incoming analog wave form converted to a corresponding digital wave form.

Referring now to FIGS. 2 and 3, incoming data 202 may be modeled as an analog wave form when transceiver 108 is functioning in the analog to digital conversion mode. When operating at a typical T1 rate of 1.544 MHz, a typical sample period T is suitably on the order of 648 nanoseconds (ns). That is, each analog data pulse is expressed within a window of duration T=648 ns. One of the functions of transceiver 108 is to determine whether a "zero" or a "one" data value is contained-within each sample window. If the slicer clock associated with transceiver 108 is perfectly synchronized with the clock which controlled data transmission, each data pulse would theoretically be sampled at its peak value, whereupon the data would be sampled and reproduced in digital form without error. However, it is known that the communication channel often imparts "jitter" to the data, meaning that the sample clock of receiver 108 may not be perfectly synchronized with the clock which coordinated transmission of the data in the first place. Thus, if transceiver 108 samples an analog data pulse too early or too late, a false reading could result. Thus, an important function of transceiver of 108 is to filter the digital data 206 to determine whether the data was indeed sampled at the optimum point within the sample window. Filter 210 thus outputs error signal 208 to clock recovery block 218, such that a control signal 220 may be applied to ADC 204 in an attempt to synchronize the slicer clock within ADC 204 with the system clock which controlled transmission of incoming data 202.

With continued reference to FIG. 3, an exemplary portion of analog waveform 202 is illustrated as including four sample periods, $T_1$, through $T_4$. In sample window $T_1$, analog waveform 304 comprises a +1 data bit. Analog value 306 within window $T_2$, having no appreciable amplitude, corresponds to a zero data bit. Analog value 308 in sample window $T_3$ corresponds to a −1 data point, and analog value 310 in sample window $T_4$ corresponds to a +1 data bit. ADC 108 suitably converts this incoming analog data to an output digital data stream. As shown, transceiver 108 outputs a binary "1" value 312 corresponding to analog value 304 within time window $T_1$, a binary "0" value data bit 314 in window $T_2$, a binary 1 value bit 316 in window $T_3$, and a binary 1 value bit 318 in window $T_4$. In the preferred embodiment, transceiver 108 outputs either a 0 or a 1, regardless of whether the binary 1 bit actually corresponds to a positive or a negative voltage. Alternatively, transceiver 108 may be configured to output three discreet values: +1, −1, or 0.

Figure 4:
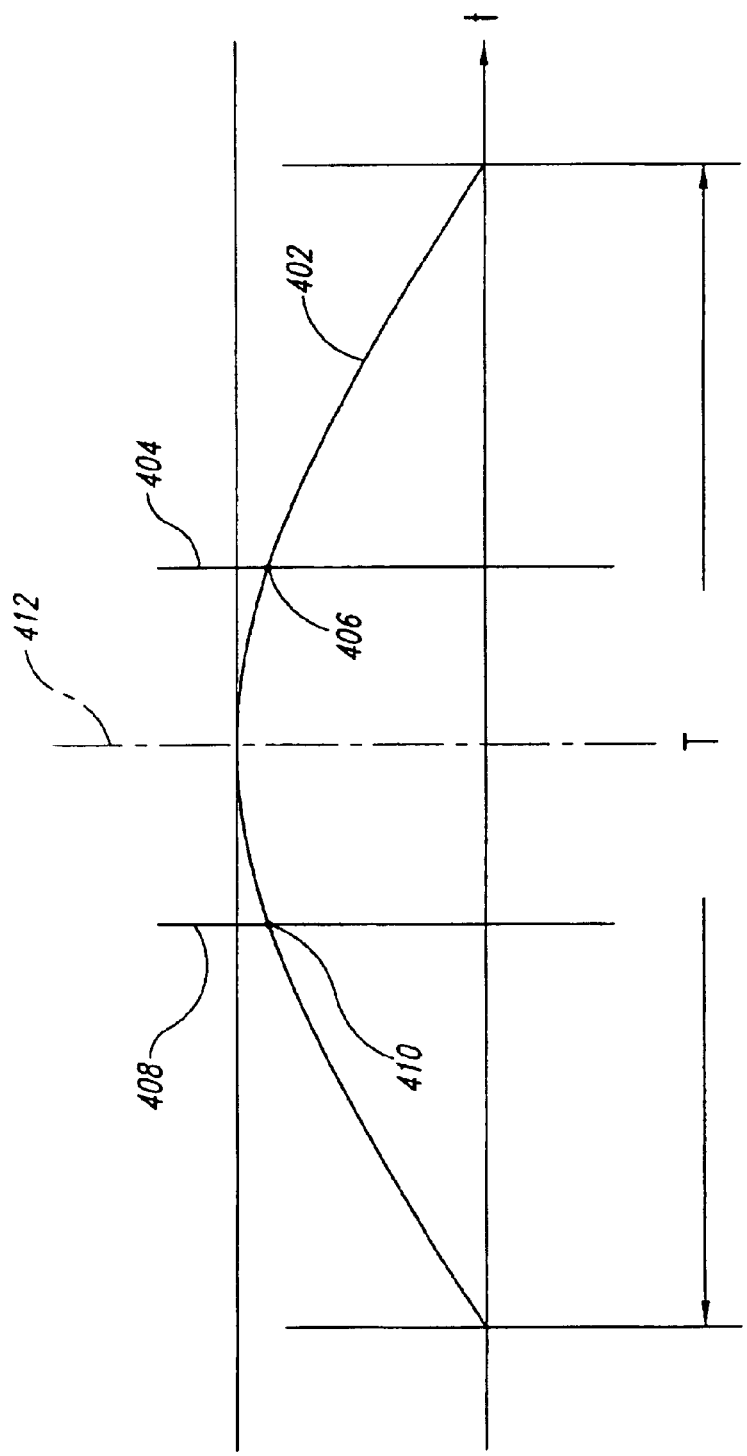
FIG. 4 is a schematic representation of a single binary pulse, illustrating a peak sample point, an early sample point, and a late sample point.

Referring now to FIG. 4, it is desirable to sample an analog data bit at an optimum point within a sample window T. Depending on the particular format of the data, it may be desirable to sample the data where an amplitude peak is anticipated, for example in the middle of the window at midpoint 412. It will be appreciated that if a data point is sampled at a point in the sample window remote from the peak amplitude value, an erroneous conversion could result. This is particularly true with distorted signals.

A well known prior art technique for correcting jitter is known as the early/late interpolation technique. With continued reference to FIG. 4, one prior art implementation of an early/late sampling technique involves taking a sample 412 at a point in the sample window which is estimated to be nearest the peak amplitude value of the data point, for example at point 412. In accordance with one version of this prior art early/late sampling technique, an early sample point would also be taken at a point 408 in the sample window which would correspond to an amplitude magnitude 410. In addition, another sample would be taken late in the time window, for example at a point corresponding to time 404, and having an associated amplitude value 406. The system would then employ various computational techniques to adjust the timing of the sample clock based on these early and late sample points, for example by attempting to drive the difference between magnitude 410 and magnitude 406 to zero by adjusting the timing of the sample clock. This technique, however, has proven to be computationally intensive and often requires 4x or even greater sampling to produce satisfactory results. In the context of many existing T1/E1 transceiver chip sets, 4x and greater sampling is not an attractive option.

Figure 5:
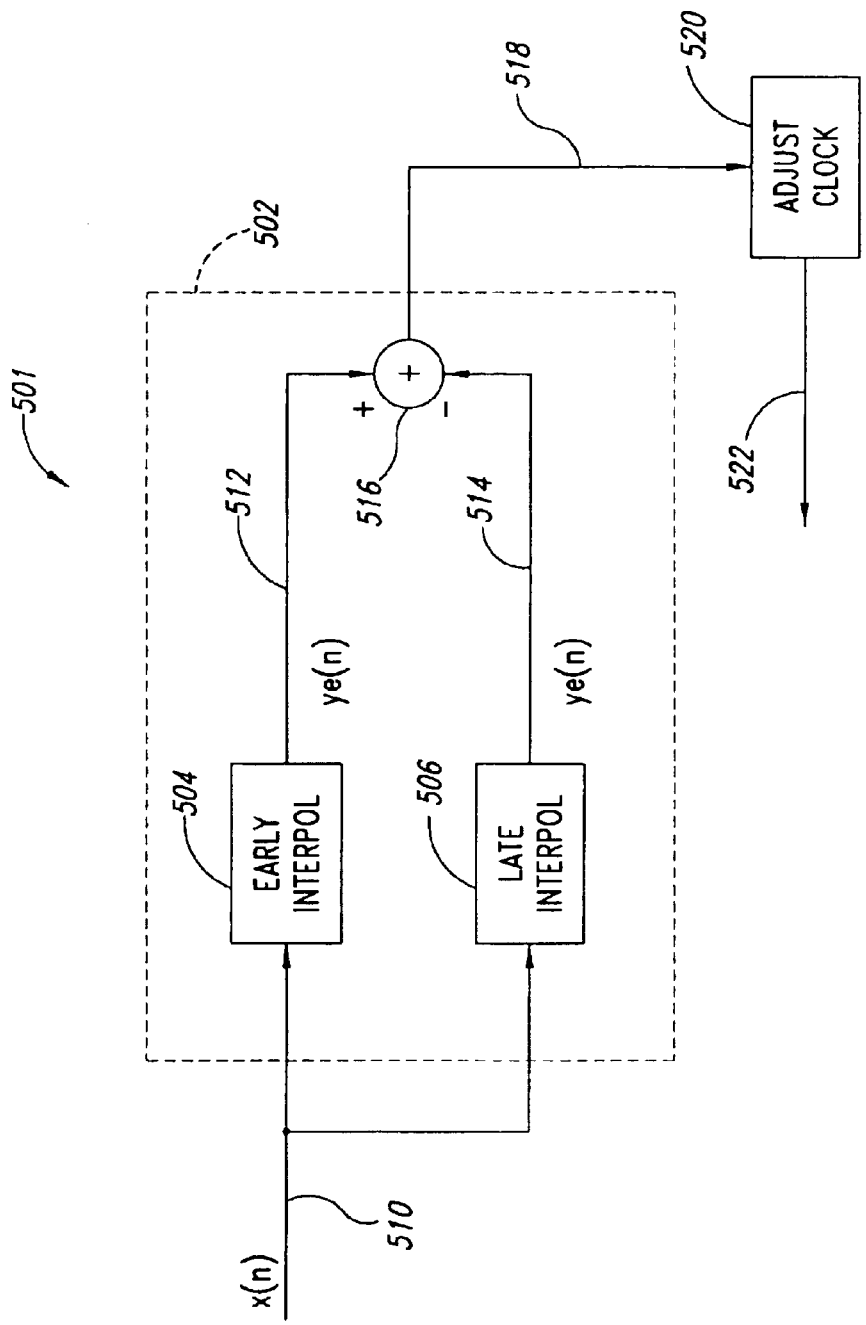
FIG. 5 is a schematic block diagram of an early/late interpolation filter.

Referring now to FIG. 5, another known interpolation technique involves taking a sample point at what is believed to be the midpoint of the timing window or at a point otherwise calculated to sample the analog data point at its maximum value, and to apply that data point x(n) to an input 510 of a timing correction circuit 501. In the illustrated embodiment, timing correction circuit 501 suitably comprises an early/late interpolation filter 502, and a clock adjustment module 520.

With continued reference to FIG. 5, the sampled data point is applied to interpolation filter 502, wherein an early interpolation filter 504 generates an early interpolation output $y_e(n)$. The sampled data point x(n) is also applied to a late interpolation filter 506, which produces a late interpolated point $y_l(n)$. The early and late interpolated data values are applied to a subtractor 516, whereupon the difference between the early and late interpolated values is applied to clock adjustment module 520. Clock adjustment module 520, in turn, generates a control signal 522, which is a function of the difference between the early and the late interpolated values. Control signal 522 may then be applied to the ADC slicer clock so that over time the difference between the early and late interpolated points is minimized. In this way, the ADC sample clock may be advantageously synchronized with the incoming data frames.

Figure 6:
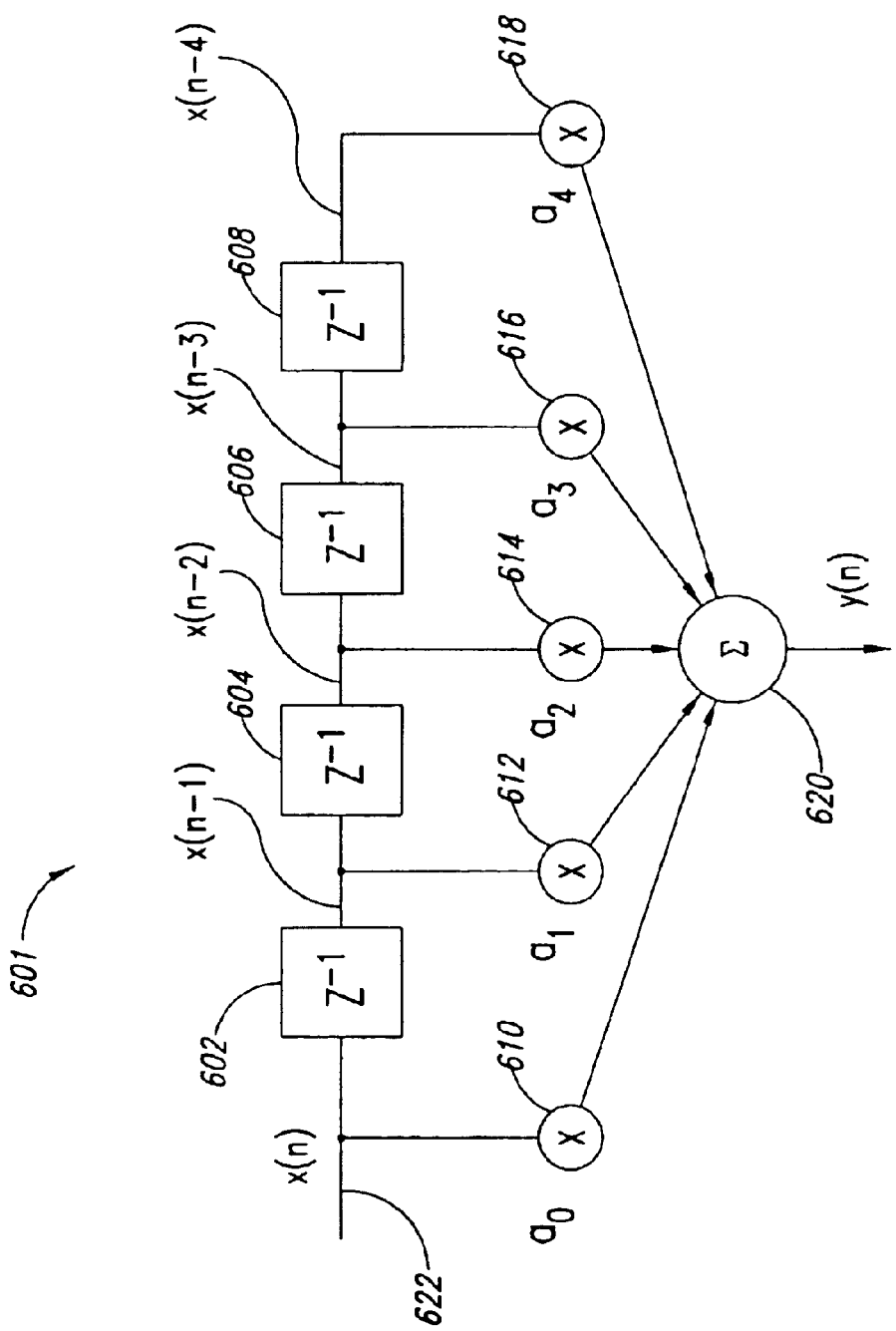
FIG. 6 is a schematic block diagram of an exemplary finite impulse response filter.

Referring now to FIGS. 5 and 6, early interpolation filter 504 and late interpolation filter 506 may each be modeled by a Finite Impulse Response (FIR) filter. With particular reference to FIG. 6, an exemplary FIR filter 601 suitably comprises a data input line 622 and a series of delay elements 602–608. Filter 601 further comprises a series of multiplication units 610–618, whose outputs are applied to a summer 620. Each multiplier 610–618 has associated therewith a coefficient $a_n$. This coefficient may either be predetermined and static or, alternatively, it may be dynamically reconfigured during steady state operation of the filter. In the context of a preferred embodiment of the present invention (discussed below), these coefficients are predetermined and static; in an alternate embodiment, however, these coefficients may be updated dynamically.

Filter 601 operates as follows. With each clock pulse, a new data point x(n) is applied to input line 622. In a typical case, the data point will either be a binary zero or a binary one, although it will be appreciated that it could be any value depending on the sampling instant, noise, and jitter. At each clock pulse, the newest incoming data point x(n) is applied to multiplier 610 and multiplied by coefficient $a_0$. Similarly, the output of first delay element 602, namely data point x(n−1) corresponding to the input data point from the previous clock cycle, is applied to multiplier 612 and multiplied by coefficient $a_1$. Similarly, the output of delay element 604, namely, x(n−2) corresponding to the incoming data point two clock pulses ago, is applied to multiplier 614 and multiplied by coefficient $a_2$, and so on. At each clock pulse, the respective outputs of multipliers 610–618 are added at summer 620, to produce output y(n). Thus, for the illustrated filter 601, each output data point y(n) is a function of five data points corresponding to input data from the then current clock pulse as well as from the previous four clock pulses and the various coefficients associated with multipliers 610–618. Although filter 601 is illustrated as a fourth order filter (four multiplication modules), it will be appreciated that virtually any order filter may be employed in the context of the present invention. In this regard, the present inventors have determined that a fourth order and a seventh order filter have produced acceptable results.

More particularly, and with continued reference to FIG. 6, the output of filter 601 may be expressed as:

$$y(n)=a_0 x(n)+a_1 x(n-1)+a_2 x(n-2)+a_3 x(n-3)+a_4 x(n-4) \qquad \text{(eq. 1)}$$

With continued reference to FIGS. 5 and 6, equation 1 represents the general equation for the output of early interpolation filter 501 and late interpolation filter 506. More specifically, the output of early interpolation filter 504 may be expressed as follows:

$$y_e(n)=a_0 x(n)+a_1 x(n-1)+a_2 x(n-2)+a_3 x(n-3)+a_4 x(n-4) \qquad \text{(eq. 2)}$$

where the coefficients $a_0$–$a_4$ represent the coefficients used to calculate an early interpolation value. Similarly the output of late interpolation 506 may be expressed as:

$$y_l(n)=b_0 x(n)+b_1 x(n-1)+b_2 x(n-2)+b_3 x(n-3)+b_4 x(n-4) \qquad \text{(eq. 3)}$$

Where the coefficients $b_0$–$b_4$ are the coefficients employed by late interpolation filter 506 to compute a late interpolated value. For a broader discussion of selecting filter coefficients to perform interpolation computations, see, for example, *Digital Communications,* 2d ed., (1994) by Edward Lee and David Messerschmitt; and *Introduction to Shannon Sampling and Interpolation Theory,* R. J. Marks, II (1991).

The output 518 of subtractor 516 may then be expressed as the difference between early interpolated value 512 and late interpolated value 514 as follows:

$$y_e(n)-y_l(n)=[a_0-b_0]x(n)+[a_1-b_1]x(n-1)+[a_2-b_2]x(n-2)+[a_3-b_3]x(n-3)+[a_4-b_4]x(n-4) \qquad \text{(eq. 4)}$$

Thus, the output 518 of interpolation filter 501 may be expressed mathematically as a series of sequential data points, each multiplied by the difference between an "early" coefficient and a "late" coefficient.

Figure 7:
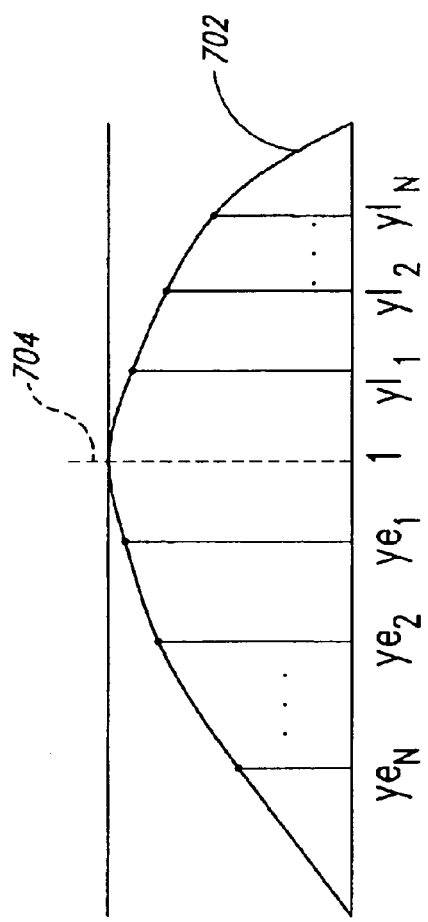
FIG. 7 is a schematic representation of an exemplary data bit, illustrated as being sampled at "N" early points and "N" late points.
Figure 8:
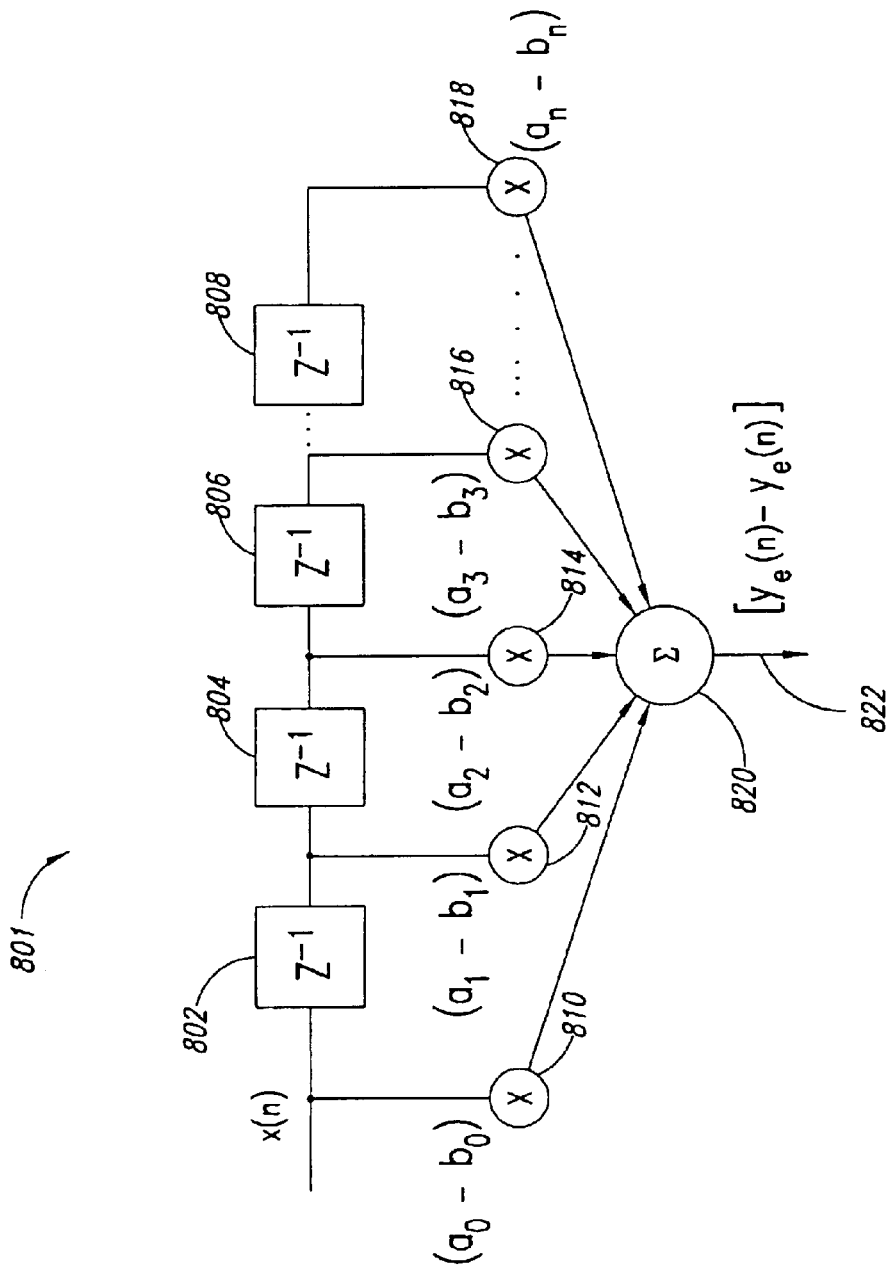
FIG. 8 is a schematic block diagram representation of an interpolation FIR filter of the present invention.

Referring now to FIG. 8, the present inventors have determined that the mathematical equivalent of the interpolation filter shown in FIG. 5 may be implemented in a filter 801, comprising only a single delay element and corresponding multiplication element per filter tap, and that the "difference" between an early interpolated value and a late interpolated value may be expressed with a single multiplication of a data point and a coefficient, wherein the coefficient is a composite coefficient reflective of the "difference" between an early and a late interpolated value. Indeed, the present inventors have further determined that such a composite coefficient may contemplate virtually any number of interpolated values, as described in greater detail below in connection with FIG. 7.

With continued reference to FIG. 8, filter circuit 801 suitably comprises respective delay elements 802–808, recognizing that virtually any number of delay elements (taps) may be employed. Filter 801 further comprises respective multipliers 810–818, it being understood that virtually any number of multipliers may also be employed, as desired.

In accordance with a preferred embodiment of the present invention, the coefficient associated with multiplier 810 may be expressed as $(a_0-b_0)$, and the coefficient associated with multiplier 812 may be expressed as $(a_1-b_1)$, and so on. Thus, the coefficients themselves embody the "difference" between the early and late values, thus eliminating the need for the subtractor 516 (see FIG. 5), as well as allowing virtually any number of interpolated values to be computed using a single, composite coefficient. Note that the output 822 of circuit 801 is the same value determined in equation 4 with respect to FIG. 5.

Referring now to FIG. 7, it may be desirable to compute many interpolated values, for example N early interpolated values and N late interpolated values to more precisely control the timing of the sample clock. In a preferred embodiment, N may be any desired integer between 1 and 20, and preferably between 2 and 5. Indeed, the circuit topology set forth in FIG. 8 may accommodate as many interpolation values as desired, using only the minimum hardware necessary to accommodate a delay element and a multiplier element; it will be appreciated that the various interpolated values (and their differences) can be accommodated in the expression of the coefficients corresponding to each of the multiplier modules.

For example, to employ the filter shown in FIG. 8 with three early interpolated data points and three late interpolated data points, the output for any arbitrary multiplication stage (tap) may be expressed as:

$$\sum_{i=1}^{3} ye_i(n) - \sum_{i=1}^{3} yl_i(n) = [ye_1(n) - yl_1(n)] + [ye_2(n) - yl_2(n)] + [ye_3(n) - yl_3(n)] \quad \text{(eq. 5)}$$

Where i=3 corresponds to the three early and late interpolated data points.

Indeed, the expression for output 822 in FIG. 8 may be generalized as follows to contemplate any number of interpolated values and any number of filter taps, all implemented within the topology shown in FIG. 8. The generalized expressions for an 20 early interpolated value $ye_i(n)$ and a late interpolated value $yl_i(n)$ are set forth as equations 6 and 7, respectively, where M is the order of the interpolation filter, i.e., M corresponds to the number of multiplication stages:

$$ye_i(n) = \sum_{j=0}^{M} a_{ij} x(n-j) \quad \text{(eq. 6)}$$

$$yl_i(n) = \sum_{j=0}^{M} b_{ij} x(n-j) \quad \text{(eq. 7)}$$

The timing error (output 822 in FIG. 8) may then be generalized as follows by taking the difference between the early and late interpolated values, where N is the number of interpolated values:

$$\text{timing error} = \sum_{i=1}^{N} \sum_{j=0}^{M} a_{ij} x(n-j) - \sum_{i=1}^{N} \sum_{j=1}^{M} b_{ij} x(n-j) \quad \text{(eq. 8)}$$

Interchanging the order of summation, yields:

$$\text{timing error} = \sum_{j=0}^{M} \sum_{i=1}^{N} a_{ij} x(n-j) - \sum_{j=1}^{M} \sum_{i=1}^{N} b_{ij} x(n-j) \quad \text{(eq. 9)}$$

$$= \sum_{j=0}^{M} x(n-j) \sum_{i=1}^{N} a_{ij} - \sum_{j=0}^{M} x(n-j) \sum_{i=1}^{N} b_{ij} \quad \text{(eq. 10)}$$

$$= \sum_{j=0}^{M} x(n-j) \left[ \sum_{i=1}^{N} (a_{ij} - b_{ij}) \right] \quad \text{(eq. 11)}$$

Figure 9:
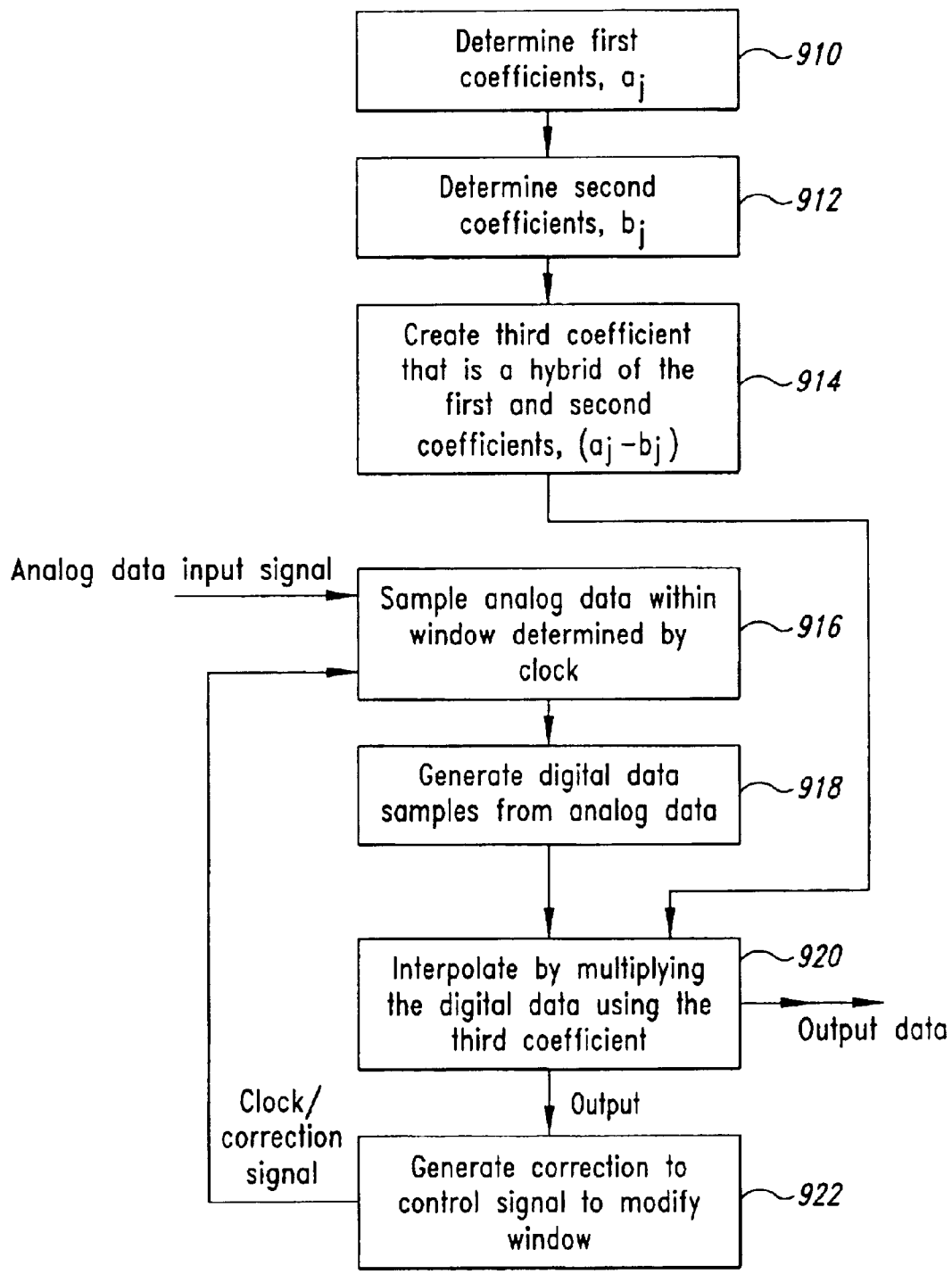
FIG. 9 is a flow chart of the present invention.

FIG. 9 illustrates a flow chart of carrying out the present invention. In particular, FIG. 9 shows determining a first series of coefficients. These would be coefficients $a_j$ for j=1 through M corresponding to M filter taps in an early interpolation filter. Next FIG. 9 shows, in step 912, determining the second coefficients. This is a series of coefficients $b_j$ for j=1 through M corresponding to M filter taps in a late interpolation filter. Next is step 914, which is generating a third series of coefficients. These coefficients will be hyper-coefficients of the first and second coefficients. Namely, the third coefficients will be expressed in the terms $a_j$–$b_j$. The coefficients of steps 910–914 can be predetermined and static or, in an alternative embodiment, these coefficients may be updated dynamically and thus the sequence of each of them may be different than the express sequences shown in FIG. 9, and each of them may be at a somewhat different location within the flowchart. For example, the third coefficient may be created dynamically just prior to step 920 since it is only necessary that it be present for the multiplying to occur in multipliers 810–818.

As illustrated in the next step, 916, there is successive sampling of an analog data signal within sequential time windows. The time windows are determined by the clock as previously discussed herein.

Subsequently, in step 918, there is generated successive digital data values x(n) representative of the sampled data. In step 920, there is computed using an interpolation filter an output signal which is a function of the hybrid coefficients ($a_j$–$b_j$) and sets excessive digital values. Specifically, there is a multiplying of the digital data using the third coefficient which is a hybrid of the first and second coefficients. The output is provided as the output data. In addition, in a subsequent step 922, there is a generation of a correction signal which is used to modify the clock window. This correction to the control signal is a function of the output signal. It is applied as a correction signal to said clock.

The foregoing description is of preferred exemplary embodiments only, and the invention is not limited by the various illustrations and descriptions set forth therein. Various changes in modifications can be made to the design and implementation of the component shown in the illustrated embodiments, without departing from the spirit and scope of the invention as set forth in the appended claims.

We claim:

1. A method of generating a control signal for use in adjusting a slicer clock in an analog-to-digital converter, comprising the steps of:

determining a first series of coefficients $a_j$ for j=1 through M corresponding to M filter taps in an early interpolation filter;

determining a second series of coefficients $b_j$ for j=1 through M corresponding to M filter taps in a late interpolation filter;

successively sampling an analog data signal within sequential time windows;

generating successive digital data values x(n) representative of the sampled data;

applying the successive digital data values to an interpolation filter having M taps wherein each tap has an associated hybrid coefficient expressed as ($a_j$–$b_j$);

computing, using said interpolation filter, an output signal which is a function of: i) said hybrid coefficients ($a_j$–$b_j$); and ii) said successive digital values; and generating said control signal as a function of said output signal.

2. The method of claim 1, wherein said output signal is a function of said hybrid coefficients ($a_j$–$b_j$) multiplied by a respective one of said digital values for each of said M filter taps.

3. The method of claim 1, wherein said computing step comprises computing output signal y(n) in accordance with the following equation:

$$y(n) = \sum_{j=0}^{M} x(n-j)[a_j - b_j].$$

4. The method of claim 1, further comprising the steps of determining a plurality of said first series of coefficients and a plurality of series of said second coefficients, and wherein said computing step comprises computing said output signal y(n) in accordance with the following equation:

$$y(n) = \sum_{j=0}^{M} x(n-j) \left[ \sum_{i=1}^{N} (a_{ij} - b_{ij}) \right]$$

wherein N corresponds to a predetermined number of early and late interpolated values per filter tap.

5. The method of claim 4, wherein M=4.

6. The method of claim 4, wherein M=7.

7. A method of compensating for signal jitter, comprising:
determining a first coefficient of the type used in an early interpolation filter;
determining a second coefficient of the type used in a late interpolation filter;
determining a third coefficient comprising the difference between said first and said second coefficients;
transmitting a signal to a receiver;
sampling said signal at said receiver as a function of a clock;
multiplying the sampled signal by said third coefficient to generate a correction signal;
applying said correction signal to said clock.

8. The method of claim 7, wherein:
determining a first coefficient further comprises determining a plurality of first coefficients $a_j$, where $j$ is an integer from 1 to N;
determining a second coefficient further comprises determining a plurality of second coefficients $b_j$, where $j$ is an integer from 1 to N;
determining said third coefficient further comprises determining the respective differences $(a_j-b_j)$; and
said multiplying step comprises multiplying said sampled data as a function of said respective differences $(a_j-b_j)$.

9. The method of claim 7, wherein said transmitting a signal comprises transmitting said signal to a T1 receiver frame.

10. The method of claim 7, wherein:
said sampling comprises slicing said signal into sequential data values x(n) at a frequency determined by said clock;
said multiplying comprises successively applying each of said data values to delay unit and multiplying the contents of said delay unit by said third coefficient.

11. The method of claim 7, wherein said receiver comprises an analog-to-digital converter and said clock.

12. The method of claim 10, wherein said multiplying comprises multiplying the sampled signal in a finite impulse response (FIR) filter having M filter taps.

13. The method of claim 12, wherein said steps of:
determining a first coefficient;
determining a second coefficient; and
determining a third coefficient are performed for each of said M taps.

14. The method of claim 13, wherein said correction signal is a function of the timing error exhibited by said clock.

15. The method of claim 14, wherein said timing error is characterized by:

$$= \sum_{j=0}^{M} x(n-j) \left[ \sum_{i=1}^{N} (a_{ij} - b_{ij}) \right].$$

and N is the number of interpolated values.

16. The method of claim 12, wherein M=4.

17. The method of claim 15, wherein N is greater than one and less than 21.

18. A finite impulse response filter for generating an output signal useful in generating a jitter correction signal to be applied to a slicer clock, comprising:
M delay elements;
M+1 multipliers;
a plurality of coefficients applied to the multipliers, each of said coefficients being expressed as $(a_j-b_j)$ where j=0 through M, and wherein each $a_j$ value comprises at least one early coefficient value and each $b_j$ value comprises a late coefficient value; and
a summer configured to receive the outputs of said M+1 multipliers that multiply the input by said coefficient and to add said outputs together to form a sum.

* * * * *